United States Patent [19]

Saito et al.

[11] Patent Number: 5,096,854
[45] Date of Patent: Mar. 17, 1992

[54] METHOD FOR POLISHING A SILICON WAFER USING A CERAMIC POLISHING SURFACE HAVING A MAXIMUM SURFACE ROUGHNESS LESS THAN 0.02 MICRONS

[75] Inventors: Yuichi Saito, Urawa; Shinsuke Sakai, Noda; Hisao Hayashi, Atsugi; Takeshi Matsushita, Sagamihara, all of Japan

[73] Assignees: Japan Silicon Co., Ltd.; Sony Corporation, both of Japan

[21] Appl. No.: 367,637

[22] Filed: Jun. 19, 1989

[30] Foreign Application Priority Data

Jun. 28, 1988 [JP] Japan ............... 63-160310
Jul. 19, 1988 [JP] Japan ............... 63-180010

[51] Int. Cl.$^5$ ............... H01L 21/00; H01L 21/02; H01L 21/304
[52] U.S. Cl. ............... 437/225; 437/228; 156/636; 156/645; 156/662; 148/DIG. 51; 51/281 R; 51/283 R
[58] Field of Search ............... 437/225, 228; 51/281 R, 51/283 R, 296, 309, 131.4, 384; 148/DIG. 51; 156/645, 345, 636, 647, 662, 903

[56] References Cited

U.S. PATENT DOCUMENTS

| | | |
|---|---|---|
| 3,342,652 | 9/1967 | Reisman ............... 156/645 |
| 3,841,031 | 10/1974 | Walsh ............... 51/283 R |
| 3,874,129 | 4/1975 | Deckert et al. ............... 51/283 |
| 3,915,671 | 10/1975 | Kagawa ............... 51/296 |
| 4,057,939 | 11/1977 | Basi ............... 51/281 R |
| 4,598,053 | 7/1986 | Yamakawa et al. ............... 51/309 |

FOREIGN PATENT DOCUMENTS

| | | |
|---|---|---|
| 2063961 | 7/1971 | France . |
| 0114849 | 7/1983 | Japan . |
| 0155168 | 9/1983 | Japan . |

Primary Examiner—Brian E. Hearn
Assistant Examiner—B. Everhart
Attorney, Agent, or Firm—Cushman, Darby & Cushman

[57] ABSTRACT

The present invention relates to a method for polishing a silicon wafer. The method comprises the steps of: (a) supplying a polishing fluid to a polishing surface, the polishing fluid including an alkaline fluid and polishing particles of high-purity silica dispersed in the alkaline fluid, the polishing surface being planar; (b) bringing a silicon wafer in contact with the polishing surface; and (c) moving at least one of the silicon wafer and the polishing surface relative to the other, thereby polishing the silicon wafer. The method is characterized by the following: the polishing surface is made of a ceramic material harder than the silicon wafer and more resistant to mechanochemical polishing than silicon, and the maximum roughness of the ceramic is less than 0.02 μm.

15 Claims, 7 Drawing Sheets

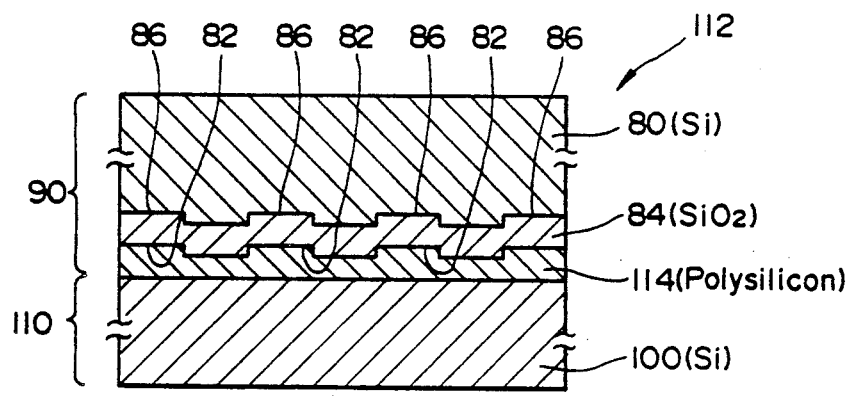
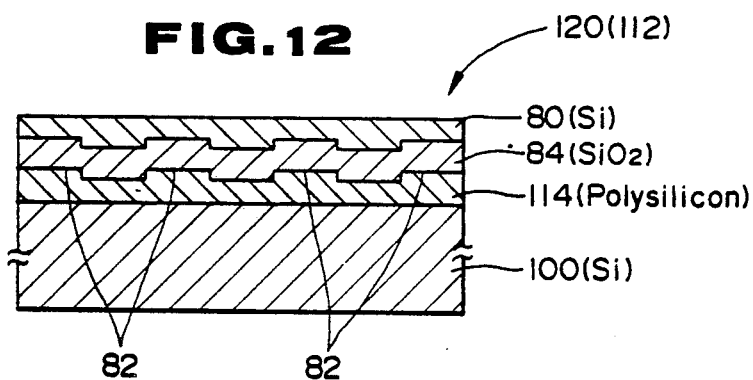
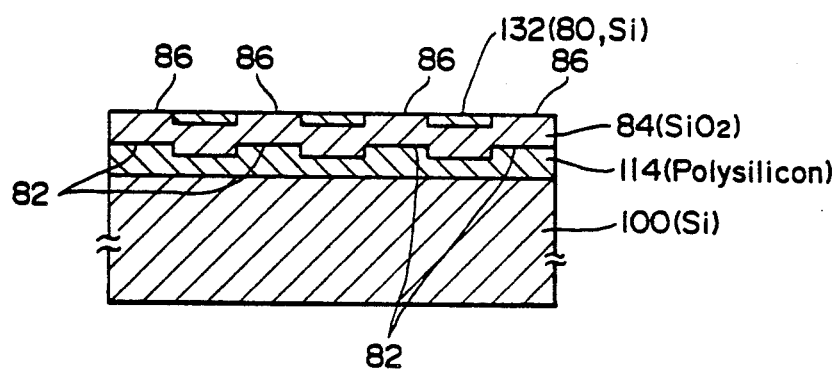

METHOD FOR POLISHING A SILICON WAFER USING A CERAMIC POLISHING SURFACE HAVING A MAXIMUM SURFACE ROUGHNESS LESS THAN 0.02 MICRONS

BACKGROUND OF THE INVENTION

The present invention relates to a method for polishing a silicon wafer to provide an extremely flat, damage-free mirror surface, which is especially suitable for semiconductor devices. The present invention also relates to a method for producing a silicon wafer.

Conventionally, in order to provide a mirror surface and the flatness required for semiconductor device fabrication, polishing is accomplished by a mechanochemical process in which a polishing pad of synthetic fibers, an alkaline polishing fluid, and fine silica particles are used. The silicon wafer is supported between a base plate covered with a polishing pad and a carrier plate to which the wafer adheres, or the wafer may be held between two base plates covered with polishing pads about 2 mm thick. A pressure of 100 to 500 g/cm² is applied to the wafer surface. The wafer is mechanochemically polished by means of relative movement between the base plate and the wafer, as for example, by the rotation of the base plate and the carrier plate, supplying polishing fluid which includes an alkaline fluid in a pH range of 10 to 12, and using polishing particles of high-purity silica of 0.02 to 0.10 $\mu$m.

With such a method, the pressure is applied to the surface of the wafer via the cloth, whereby a uniform pressure is generated over the entire surface owing to the compressive deformation of cloth, and therefore the differences in rate of among areas of the silicon wafer are small.

However, a problem develops because of the generally uniform rate of removal as shown in FIG. 1. In FIG. 1, a silicon wafer 20 includes a surface 22 to be polished which has a variation in thickness. In the polishing process, a volume 24 of the silicon wafer is removed and a surface 26 is exposed. According to the generally uniform rate of removal, thickness variations still remain on the surface 26. In order to finish the surface 26 to the flatness required for VLSI fabrication, much time is spent removing a relatively large amount of material. Recently, to meet the stricter thickness variation specifications, harder and harder polishing cloths (pads) are employed, however reducing the total thickness variation to less than 2 $\mu$m is nonetheless very difficult.

Recently, in device development design, smaller size and higher integration are increasingly important considerations. To meet these requirements, we must consider the use of a step-and-repeat-camera in the photolithographic process, as well as for example, focusing, condition of the surface with which focusing must coincide during resist coating, film formation, and etching off. Practically, for example, to produce a submicron device, thickness variations of wafers at 15×15 mm or 20×20 mm must be less than 1 $\mu$m, preferably 0.5 $\mu$m. The requirement for total thickness variation of a wafer used must now therefore be less than 2 $\mu$m.

In recent years, the dielectric-isolation structure, the Bi-CMOS structure, and the SOI (Silicon-On-Insulator) structure devices were developed. In the SOI structure, and island of monocrystaline silicon, polycrystaline silicon, or amorphous silicon is formed; and a dielectric or insulator area is also formed on a substrate. It is necessary to polish the silicon island and the dielectric area to be damage-free according to the method described above. In addition, the thickness of the silicon island must be adjusted to the device to be fabricated. The circuit defined by the silicon island must have a desirable properties.

In the method, for example, a substrate 30 made of a monocrystaline silicon or polycrystaline silicon is first prepared as shown in FIG. 2. An insulator raised pattern 32 of SiO$_2$ is formed on one surface of the substrate 30. Next, by means of a thin-film forming method such as CVD (Chemical Vapor Deposition), a silicon layer 34 made of monocrystaline or polycrystaline silicon is formed on the surface of the substrate 30 in such a manner that the insulator pattern 32 is surrounded by the substrate 30 and the silicon layer 34, so that the unfinished silicon wafer shown in FIG. 2 is produced with some thickness variations.

To flatten the surface of the wafer, three methods are known, (a) the etch-back method, (b) the reflow method, and (c) the selective polishing method. However, the etched back method requires much processing and only produces a tolerance of $\pm 0.2$ $\mu$m, and the reflow method is applied only to the wiring process. Therefore, the selective polishing process is the only solution.

After initial processing, the selective polishing method is applied to finish the outer surface of the silicon layer 34, so that the silicon layer is surrounded laterally by the insulator pattern as shown in FIG. 3. In the polishing method, when the polishing removal reaches the insulator pattern 32, the removal rate becomes very low. Then, the polishing pad is deformed compressively to excavate the silicon island 40 as shown in FIG. 3. (In FIG. 3, numbers 36 and 38 designate the surfaces of the silicon wafer before and after polishing, respectively.) Therefore, the thicknesses of the crystal island on which circuit is later to be fabricated varies, differing from an identical finished wafer shown in FIG. 4, and thus defocusing is occurred in the photolithographic process.

If it is necessary that the device structure has a certain thickness remaining over the insulator pattern 32 as shown in FIG. 5. Polishing with the polishing pad must not flatten the surface 38 nor control the thickness of the remained silicon layer 34 over the insulator pattern 32.

SUMMARY OF THE INVENTION

It is therefore an object of the present invention to provide a method for polishing a silicon wafer for providing a damage-free mirror surface with a degree of flatness suitable for submicron lithography, and to provide selective polishing of an unfinished wafer which has some warp and thickness variation produced by the arrangement of the insulator pattern and the deposition of the silicon.

Another object of the present invention is to provide a method for producing a silicon wafer for providing a mirror surface with a degree of flatness suitable for submicron lithography and having a desired thickness.

According to the method for polishing a silicon wafer related to the first embodiment of the present invention, the method comprises the steps of: (a) supplying a polishing fluid to a polishing surface made of a ceramic material, the polishing fluid including an alkaline fluid and polishing particles of high-purity silica dispersed in the alkaline fluid, the polishing surface being harder than the silicon wafer and more resistant to mechanochemical polishing than silicon, the polishing surface having maximum roughness ($R_{max}$) of less than 0.02 $\mu$m; (b) pressing the silicon wafer into contact with the polishing surface; and (c) moving at least one of the silicon wafer and the polishing surface relative to the other, thereby polishing the silicon wafer.

In accordance with a method for producing a silicon wafer related to a second embodiment of the present invention, the method comprises the steps of: (a) preparing a substrate of a silicon wafer which has at least one planar surface; (b) forming a raised pattern on the planar surface of the prepared substrate, the raised pattern being made of a material which is more resistant to mechanochemical polishing than silicon; (c) forming a silicon layer on the planner surface of the prepared substrate, the silicon layer cooperating with said substrate to surround the raised pattern, thereby forming an unfinished silicon wafer; (d) supplying a polishing fluid to a polishing surface, the polishing fluid including an alkaline fluid and polishing particles of high-purity silica dispersed in the alkaline fluid, the polishing surface being harder than the silicon wafer and more resistant to mechanochemical polishing than silicon, said polishing surface having an maximum roughness less than 0.02 $\mu$m; (e) pressing the unfinished silicon wafer into contact with the polishing surface; and (f) moving at least one of the unfinished silicon wafer and the polishing surface relative to the other, thereby polishing mechanochemically the unfinished silicon wafer.

BRIEF DESCRIPTION OF THE DRAWINGS

FIGS. 11 through 13 are side elevations showing a production process of a silicon wafer according to an actual method of the second embodiment of the present invention.

DETAILED DESCRIPTION OF THE PREFERRED EMBODIMENTS

With reference to the accompanying drawings, various preferred embodiments will be described hereinafter.

FIRST EMBODIMENT

Figure 6:
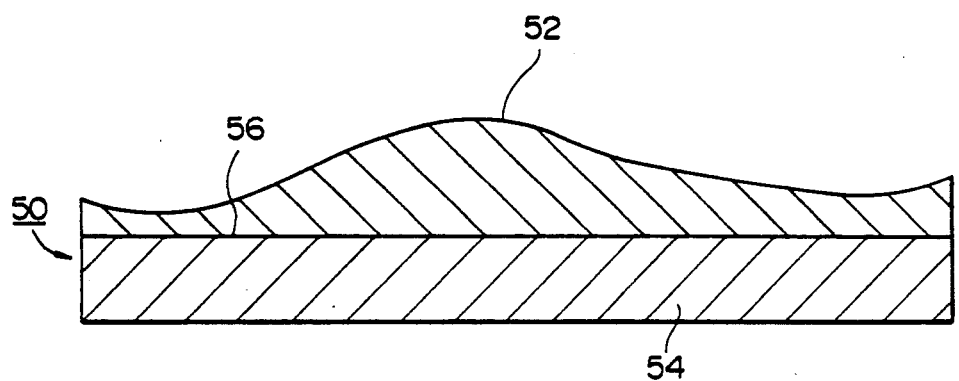
FIG. 6 is a side elevation showing a silicon wafer with surfaces before and after polishing using a method for polishing according to the first embodiment of the present invention.
Figure 1:
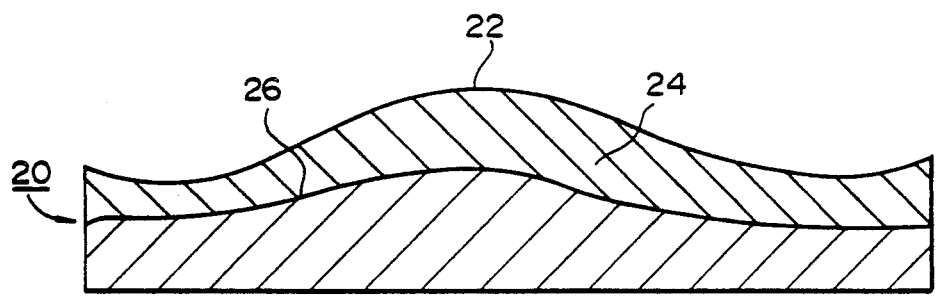
FIG. 1 is a side elevation showing a silicon wafer with surfaces before and after polishing by the prior art.
Figure 2:
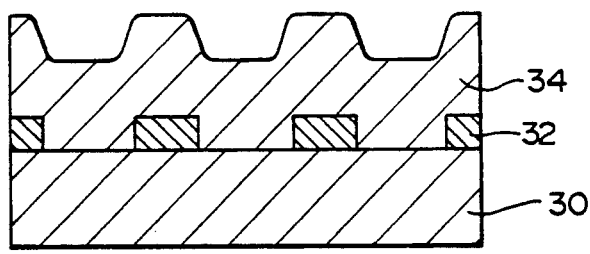
FIG. 2 is a side elevation showing another silicon wafer before polishing by a method for producing a silicon wafer which is compared with the present invention.
Figure 5:
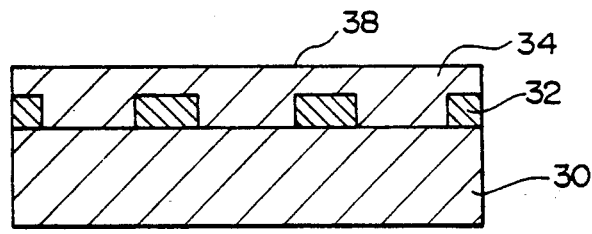
FIG. 5 is a side elevation showing another example of a desired silicon wafer of desired dimensions after polishing.
Figure 3:
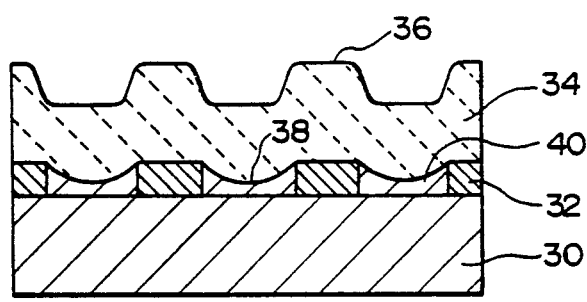
FIG. 3 is a side elevation showing the silicon wafer of FIG. 2 with surfaces before and after polishing.
Figure 4:
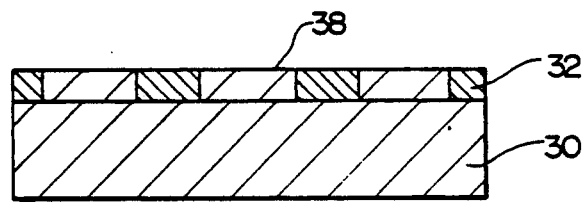
FIG. 4 is a side elevation showing an example of a desired silicon wafer of desired dimensions after polishing.

In FIG. 6, an unfinished silicon wafer 50 includes a surface 52 and has thickness variations so that the degree of flatness is outside the necessary range of tolerance. A ceramic polishing block, having a surface of a high degree of flatness is installed on a rotating apparatus. On the ceramic polishing block, polishing fluid is supplied which has an alkaline fluid in a pH of 10 to 11 and high-purity silica particles dispersed in the alkaline fluid. The wafer 50 is directly in contact with the planar surface of a polishing block at a pressure of 50 to 200 g/cm$^2$ in such a manner that the surface 52 faces generally parallel to the planar surface of the polishing block. The wafer surface is subjected to friction and the abrasion of the silica particles as well as the polishing surface of the block by rotating the polishing block, and then chemically etching. This process is well-known as mechanochemical polishing. The polishing block is made of a ceramic material to preventing the wafer from being contaminated and for the rigidity thereof. The ceramic material, which is preferably harder than the silicon wafer and more resistant to mechanochemical polishing than silicon, is preferably selected from SiO$_2$, Al$_2$O$_3$, Si$_3$N$_4$, and SiC. For example, if the ceramic material is Al$_2$O$_3$, its hardness is preferably more than 1,100 kg/mm$^2$ (Vickerse hardness with 500 g), its bending strength is preferably more than 3,000 kg/cm$^2$, its compressive strength is preferably more than 19,000 kg/cm$^2$, and its Young's modulus is preferably more than 2.5×10$^6$ kg/cm$^2$. The grain size of the polishing particles is preferably less than 0.05 $\mu$m. More preferably, the polishing particles are 0.01 to 0.02 $\mu$m in grain size.

According to the processing under the above conditions, elevated portions of the surface 52 are primarily removed. Therefore, the finished silicon wafer 54 has a damage-free mirror surface 56 of desirable flatness.

EXPERIMENT 1

A silicon wafer of a circular cross section and diameter of 125 mm was used which had a total thickness variation of 11 $\mu$m, and a maximum surface roughness of 2.5 $\mu$m. A polishing block, having a circular cross section of which the diameter was 250 mm and a thickness of 20 mm was used; the polishing block had a total thickness variation of 5 $\mu$m, and maximum surface roughness of 0.01 $\mu$m. The ceramic polishing block was made of high-purity quartz having a purity of 99.99%. The polishing fluid included an alkaline liquid of pH 10.2 and high-purity silica particles of 0.02 $\mu$m size at 5.0% by weight. The silicon wafer was applied to the polishing block at 100 g/cm$^2$. The polishing fluid was mounted on a metal plate at a temperature of 35°±1° C., so that the silicon wafer was polished at 35° C.

Under the above conditions, the silicon wafer was polished for 5 minutes. Only the upper portions of the surface of the silicon wafer were mirror-polished. Other portions of the surface were not polished.

After polishing for 35 additional minutes, the entire surface of the silicon wafer was mirror-polished. The total thickness variation of the polished silicon wafer was very small at 1.3 μm.

EXPERIMENT 2

In order to make a comparison with the results of Experiment 1, the silicon wafer was polished by the prior method with a polishing pad, and the thickness variation produced was measured. In Experiment 2, a 2 mm-thick pad fabricated of an unsaturated polyester fiber was provided on a metal polishing block. A 125 mm-diameter silicon wafer was used which had a total thickness variation of 9 μm, and a maximum surface roughness of 2 μm. Other conditions were the same as those in Experiment 1.

After polishing for 5 minutes, the entire surface of the silicon wafer was mirror-polished. The entire surface, which included some raised and some lower portions appeared to have been polished at a uniform rate.

After polishing for 35 additional minutes, the surface was polished to a mirror surface with a surface roughness of 1.5 nm. The total thickness variation of the polished silicon wafer however was still 5 μm. Therefore, the total thickness variation was not reduced using the method of Experiment 2.

SECOND EMBODIMENT

A method for producing a silicon wafer according to a second embodiment of the present invention is described hereinafter with reference to FIGS. 7 through 10.

Figure 7:
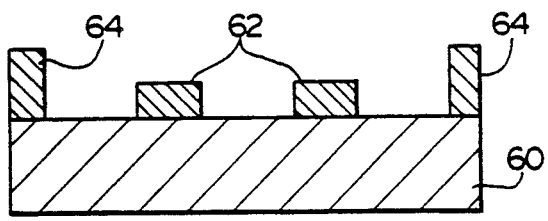
FIGS. 7 through 10 are side elevations showing a production process of a silicon wafer according to a hypothetical method of a second embodiment of the present invention.

As shown in FIG. 7, a substrate 60 made of monocrystaline silicon, polycrystaline silicon, or high-purity quartz is first prepared. Then, an insulator raised pattern 64 is formed on the surface of the substrate 60 by photolithography and dry etching. The thickness of the raised pattern 64 is determined to be the same as the thickness of the silicon layer as described in the following. Then, if necessary, an insulator raised pattern 62, which has a lesser height than the raised pattern 64, is formed by another photolithography and dry etching process. The raised patterns 62 and 64 are made of a material that is more resistant than silicon to mechanochemical polishing such as $Al_2O_3$, $SiO_2$, SiC, or $Si_3N_4$. The entire area of the raised pattern 64 is preferably in a range of 1 to 20% of the area of the substrate 60.

Figure 8:
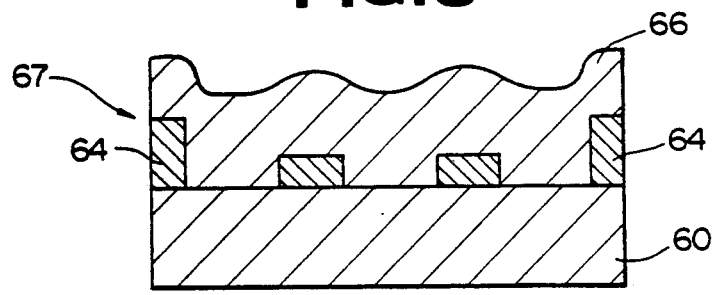

Next, by using chemical vapor deposition, a polysilicon layer 66 is formed on the surface of the substrate 60 in such a manner that the raised patterns 62 and 64 are surrounded by the substrate 60 and the polysilicon layer 66, so that the unfinished silicon wafer 67 with some thickness variation shown in FIG. 8 is produced.

Figure 9:
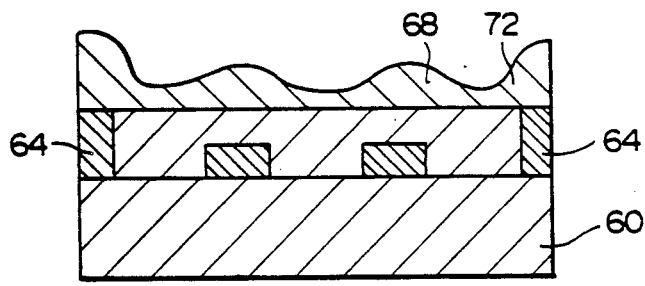
Figure 10:
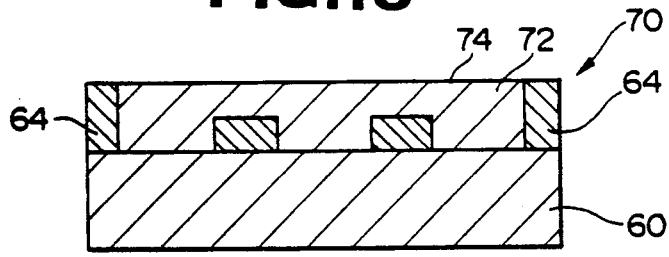

Then, a mechanochemical polishing method similar to that of the first embodiment is applied to finish the outer surface of the silicon layer 66, so that a volume 68 is removed which is above the raised pattern 64, as shown in FIG. 9. The removal rate of mechanochemical polishing is greater in the upper portion of the silicon layer 66 which does not enclose any raised patterns 62 and 64. The removal rate is then rapidly reduced when the polishing reaches the top of the higher raised pattern 64 made of the more resistant mechanochemical polishing material. Then, the polishing is terminated, thereby providing a finished silicon wafer 70 which has a silicon layer 72 of prescribed thickness and a damage-free mirror surface 74 shown in FIG. 10. The thickness of the silicon layer 72 is the same as the height of the raised pattern 64. Therefore, the raised pattern 64 functions as a braking structure during polishing.

Figure 19:
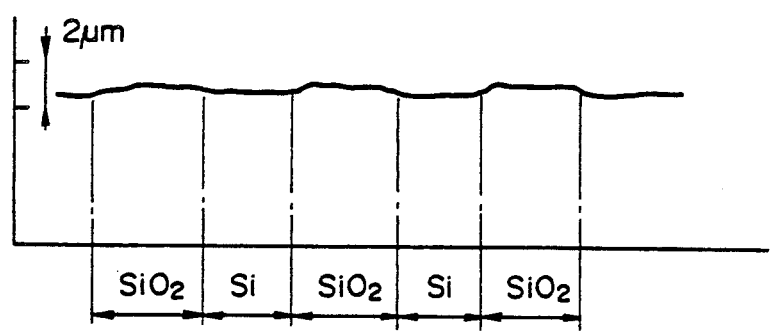
FIGS. 19 and 20 are graphs showing the thickness variation in a comparison between the second embodiment and another method.
Figure 20:
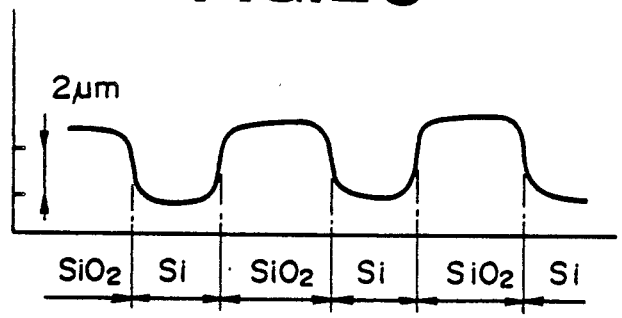

FIGS. 19 and 20 are graphs to compare between the second embodiment and with another method. FIG. 19 depicts the result according to the second embodiment. FIG. 20 depicts the result of the method using a polishing pad. From the figures, it is apparent that there is a much greater variation between the levels of the silicon islands and the $SiO_2$ portions in the method utilizing the polishing pad.

With the method for producing a silicon wafer of the second embodiment, the height of the raised pattern 64 is determined by the desirable thickness of the silicon layer 72, and therefore the method facilitates microlithography and produces uniform volumes of the polysilicon layer 72.

EXAMPLE 1

Referring to FIGS. 11 through 13, an actual example of the second embodiment will be described hereinafter. First, a substrate 80, shown in FIG. 11, made of monocrystaline silicon was prepared. On the surface of the substrate 80, grooves 82 of 0.1 μm depth were formed to be spaced 10 μm apart. Next, a 0.1 μm-thick surface layer 84 of the substrate 80, including the walls of the grooves 82, was thermally oxidized to $SiO_2$. The walls 86 of the grooves 82, which were also oxidized to $SiO_2$, projected inward to the wafer 90. Next, polysilicon layer 114 was formed by a CVD method in such a manner that the polysilicon layer 114 covers the $SiO_2$ layer 84 and fills to the grooves 82. The surface of the polysilicon layer 114 was polished according to the above-mentioned method (Experiment 1), and was flattened thereby. The substrate 80 is hereinafter referred to as wafer 90.

A substrate 100, also made of monocrystaline silicon, was prepared as is also shown in FIG. 11. The substrate 100 is hereinafter referred to as wafer 110.

After preparation, the wafers 90 and 110 were bonded to a bonded substrate 112 by means of a hydrogen junction at 1,110° C., in such a manner that the surface layers 84 and 102 faced each other.

Next, the bonded substrate 112 was ground from the outer surface of the portion (substrate) 80, to form the unfinished wafer 120 shown in FIG. 12, until the thickness of the portion (substrate) 80 equaled about 2 μm.

Furthermore, a polishing apparatus with a 250 mm-diameter of circular cross section which had a total thickness variation of 5 μm, and a maximum surface roughness of 0.01 μm, was used. The polishing block was made of high-purity $Al_2O_3$. The polishing fluid included an alkaline fluid of pH of 10.5 and was 5% by weight high-purity silica particles of 0.02 μm. The unfinished wafer 120 was pressed at 100 g/cm² against the rotating polishing block in such a manner that the surface of the polishing block and the outer surface of the portion (substrate) 80 of the wafer 120 faced each other while supplying polishing fluid to the surface of the polishing block. After about 20 minutes of polishing, the polishing block came into contact with the polycrystaline silicon layer 114 and the raised $SiO_2$ walls 86. At that time, the polishing was generally interrupted by the walls 86, and the polishing process was thereby stopped.

In the above polishing process, as shown in FIG. 13, a finished wafer 130 with an silicon island 132 (the silicon portion of the substrate 80) was produced which had a thickness generally equal to the depth of the grooves 82. When the finished wafer 130 was used as an SOI semiconductor substrate for a 256K SRAM device, the resulting device was of very high quality.

EXAMPLE 2

Figure 14:
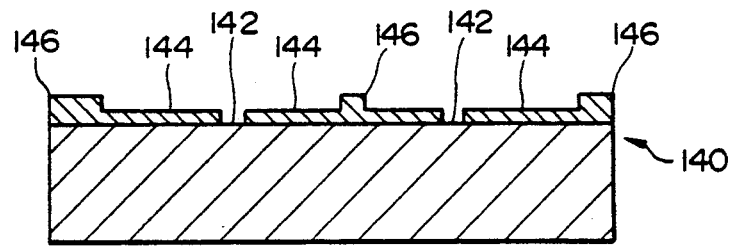
FIGS. 14 through 16 are side elevations showing a producing process for a silicon wafer according to another actual method of the second embodiment of the present invention.
Figure 15:
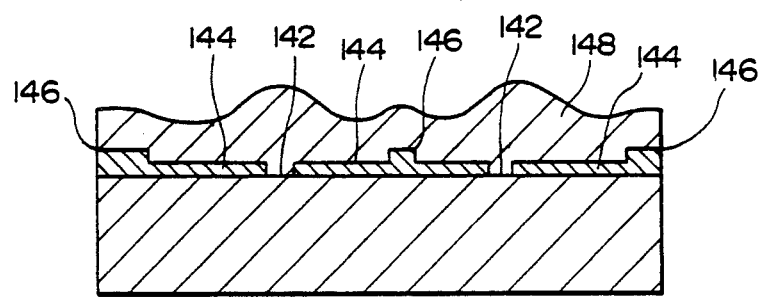
Figure 16:
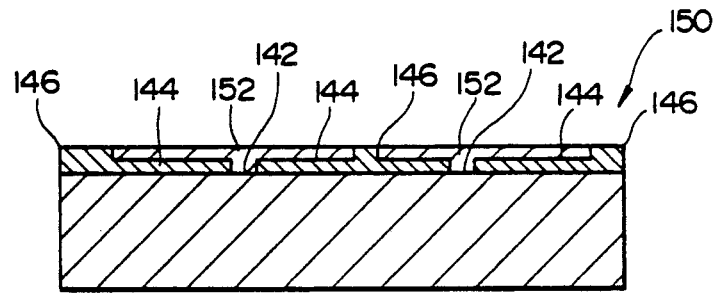

FIGS. 14 through 16 show another actual example of the second embodiment. In this example, a 1.0 μm layer of thermally oxidized $SiO_2$ was formed on a surface of a silicon crystal substrate. Then, a two-step photolithographic and etching process was applied to the $SiO_2$ surface layer, so that a substrate 140 shown in FIG. 14 was formed. The substrate 140 had a partially exposed monocrystaline silicon region 142 and a $SiO_2$ layer 144 in such a manner that some of the raised pattern 146 served as the braking structure for the mechanochemical polishing were partially formed on the surface of the $SiO_2$ layer 144.

Next, by means of a selective epitaxial method, a silicon crystal layer was grown only from the exposed surface 142, so as to surround the $SiO_2$ layer 144.

The conditions for the selective epitaxial method are as follows. The substrate 140 was heat-annealed at a temperature of 1,100° C. for 10 minutes in an atmosphere of hydrogen gas. Then, the substrate 140 was treated in an atmosphere of $SiH_2Cl_2$ gas, HCl gas, and $H_2$ gas under 30 Torr (4000 Pa) at 900° C.; this resulted in the growth of the epitaxial silicon layer 148 from the region 142. The growth rate of the epitaxial silicon was 0.1 μm/min in both vertical and lateral directions.

The epitaxial silicon layer 148 was polished to the same degree as in the previous example. After about 20 minutes of polishing, the polishing block came into contact with the $SiO_2$ raised pattern 146. Then, the rate of removal was greatly reduced by the raised pattern 146, and the polishing process was thereby interrupted.

With the above polishing process, as shown in FIG. 16, the thickness of the silicon layer 152 on a finished wafer 150 was equal to the height of the raised pattern 146 plus the thickness of the $SiO_2$ layer 144. When the finished wafer 150 was used for an advanced semiconductor device, the device was of very high quality on the silicon layer 152.

In the present invention, the silicon layer to be polished could be made of monocrystaline silicon, polycrystaline silicon, or amorphous silicon. The present invention does not limit the relative movement between the ceramic block and the wafer must be the rotation of the ceramic block. Alternatively, the holder which supports the wafer could be moved, or both the polishing block and the holder could be moved.

While in the above embodiments the reverse surface of the substrate is not polished, the invention is not so limited. Since the polishing can be simultaneously applied to two surfaces of the substrate if the substrate is held in engagement with a ring-shaped holder so that the holder holds the lateral edge of the substrate. In this case, both surfaces are polished by means of two polishing blocks facing parallel to each other. Therefore, in the second embodiment, the $SiO_2$ portions 62, 64, 84, 86, 144, and, 146 can be formed on both the obverse and reverse surfaces of the substrate.

Figure 17:
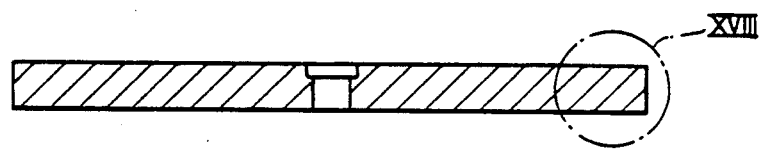
FIG. 17 is a side elevation showing a polishing block used in the above embodiments.
Figure 18:
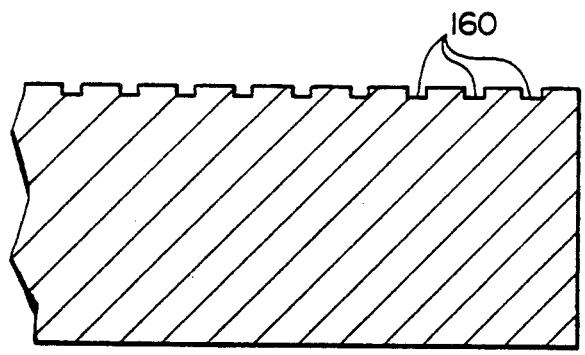
FIG. 18 is an enlarged side elevation showing a portion of the block determined by XVIII area in FIG. 17.

In order to better understand the configuration of the polishing block, an example thereof is shown in FIGS. 17 and 18. The polishing block is a circular plate with straight grooves 160 spaced 30 mm apart, extending bidirectionally like a checkerboard. The grooves 160 functions as drains for the byproducts of the mechanochemical polishing and as retainers for the polishing particles, as well as supply polishing fluid to every portion of the wafer surface. The grooves 160 are 1.5 mm in width. The total thickness variation of the surface of the polishing block is 1 μm.

What is claimed is:

1. A method for polishing a silicon wafer, the method comprising the steps of:
   (a) supplying a polishing fluid to a polishing surface made of a ceramic material, said polishing fluid including an alkaline fluid and polishing particles of high-purity silica dispersed in the alkaline fluid, said polishing surface being harder than the silicon wafer and more resistant to mechanochemical polishing than silicon, the polishing surface having a maximum roughness of less than 0.02 μm;
   (b) pressing a silicon wafer in contact with said polishing surface; and
   (c) moving at least one of the said silicon wafer and the said polishing surface relative to the other, thereby mechanochemically polishing said silicon wafer.

2. A method according to claim 1, wherein said polishing particles are of a grain size less than 0.05 μm.

3. A method according to claim 2, wherein said ceramic material is selected from the group consisting of $SiO_2$, $Al_2O_3$, SiC, and $Si_3N_4$.

4. A method according to claim 3, wherein said polishing surface has a plurality of grooves.

5. A method according to claim 2, wherein the method further comprising another said polishing surface, thereby polishing mechanochemically a pair of surfaces of the wafer.

6. A method for producing a silicon wafer, the method comprising the steps of:
   (a) preparing a substrate which has at least one planar surface, for a silicon wafer;
   (b) forming a raised pattern on said planar surface of said prepared substrate, the raised pattern being made of a material which is more resistant to mechanochemical polishing than silicon;
   (c) forming a silicon layer on said planar surface of said prepared substrate, the silicon layer cooperating with said substrate to surround said raised pattern, thereby forming an unfinished silicon wafer;
   (d) supplying a polishing fluid to a polishing surface, said polishing fluid including an alkaline fluid and a polishing particles of high-purity silica dispersed in the alkaline fluid, said polishing surface being harder than the surface of the silicon wafer and more resistant to mechanochemical polishing than silicon, said polishing surface having a maximum surface roughness of less than 0.02 μm;
   (e) pressing said unfinished silicon wafer into contact with said polishing surface in such a manner that a side of said silicon layer faces to the polishing surface; and
   (f) moving at least one of the said unfinished silicon wafer and the said polishing surface relative to the other, thereby polishing mechanochemically said unfinished silicon wafer.

7. A method according to claim 6, wherein said polishing particles are of a grain size less than 0.05 μm.

8. A method according to claim 7, wherein said ceramic material is selected from the group consisting of $SiO_2$, $Al_2O_3$, SiC, $Si_3N_4$.

9. A method according to claim 8, wherein said surface has a plurality of grooves.

10. A method according to claim 9, wherein said raised patterns are made of a material, the material being harder than said silicon layer.

11. A method according to claim 6, wherein said forming steps of the raised pattern and the silicon layer further comprise the steps of:
preparing a second substrate made of silicon which has at least one planar surface;
forming grooves on said planar surface of said second prepared substrate;
forming a layer at least at the bottom of said grooves, the layer being made of a material which is more resistant to mechanochemical polishing than silicon;
forming a silicon layer which has an outer surface on said surface of said more resistant layer in such a manner that the silicon layer covers the surface of said more resistant layer;
polishing said outer surface of said silicon layer; and
bonding said first substrate and said second substrate in such a manner that said planar surface of said first substrate and said outer surface of said silicon layer of said second substrate face each other whereby said bottom of said grooves being as said raised pattern.

12. A method according to claim 7, wherein said silicon wafer has a pair of said planar surfaces; said raised pattern and said silicon layer are formed on said pair of surfaces so that said unfinished silicon wafer has a pair of said raised patterns and said silicon layer, the method further comprising another said polishing surface, thereby polishing mechanochemically a pair of surfaces of said unfinished wafer.

13. A polishing block for mechanochemical polishing of a silicon wafer, the polishing block comprising:
a polishing surface for mechanochemical polishing said silicon wafer, said polishing surface made of a ceramic material, said polishing surface being harder than the silicon wafer and more resistant to mechanochemical polishing than the silicon wafer, said polishing surface having a maximum surface roughness less than 0.02 $\mu$m.

14. A polishing block according to claim 13, wherein said ceramic material is selected from the group consisting of $SiO_2$, $Al_2O_3$, $SiC$, and $Si_3N_4$.

15. A polishing block according to claim 1, wherein said surface has a plurality of grooves.

* * * * *